(12) United States Patent
Byeon et al.

(10) Patent No.: US 7,974,125 B2
(45) Date of Patent: *Jul. 5, 2011

(54) FLASH MEMORY DEVICE AND METHOD OF CONTROLLING FLASH MEMORY DEVICE

(75) Inventors: Dae-Seok Byeon, Seongnam-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/822,246

(22) Filed: Jun. 24, 2010

(65) Prior Publication Data

US 2010/0259982 A1 Oct. 14, 2010

Related U.S. Application Data

(63) Continuation of application No. 12/109,466, filed on Apr. 25, 2008, now Pat. No. 7,768,831.

(30) Foreign Application Priority Data

Apr. 25, 2007 (KR) .................. 10-2007-0040502

(51) Int. Cl.
*G11C 16/06* (2006.01)
(52) U.S. Cl. .......... 365/185.09; 365/185.11; 365/189.05
(58) Field of Classification Search ............. 365/185.09, 365/185.11, 185.12, 185.26, 189.05, 201
See application file for complete search history.

(56) References Cited

U.S. PATENT DOCUMENTS

| 5,438,546 | A | 8/1995 | Ishac et al. |
| 6,152,692 | A | 11/2000 | Aubry |
| 6,501,700 | B2 * | 12/2002 | Pascucci .................. 365/230.04 |
| 6,625,071 | B2 | 9/2003 | Ikeda et al. |
| 6,643,175 | B2 | 11/2003 | Yamauchi et al. |
| 6,842,377 | B2 * | 1/2005 | Takano et al. ............ 365/185.21 |
| 7,159,141 | B2 | 1/2007 | Lakhani et al. |
| 7,336,516 | B2 * | 2/2008 | Tran et al. .................... 365/49.1 |
| 2004/0003315 | A1 | 1/2004 | Lakhani et al. |
| 2005/0219898 | A1 * | 10/2005 | Im et al. .................... 365/185.09 |
| 2009/0027966 | A1 | 1/2009 | Kim et al. |
| 2009/0244975 | A1 | 10/2009 | Kang |

FOREIGN PATENT DOCUMENTS

| JP | 2002133894 | 5/2002 |
| JP | 2003109396 | 11/2003 |
| KR | 1020000061317 A | 10/2000 |
| KR | 1020010069211 A | 7/2001 |
| KR | 1020030072433 A | 9/2003 |

* cited by examiner

*Primary Examiner* — Gene N. Auduong
(74) *Attorney, Agent, or Firm* — Volentine & Whitt, PLLC

(57) ABSTRACT

A flash memory device includes multiple memory blocks, a decoder configured to select at least one of the memory blocks in response to block select signals, a controller configured to generate the block select signals in response to a block address and to generate a flag signal when the block address corresponds to a bad block, and an output buffer configured to output fixed data in response to the flag signal indicating that the block address corresponds to the bad block. When the block address corresponds to a bad block, the controller generates the block select signals to cause the decoder to interrupt selection of a memory block corresponding to the block address.

18 Claims, 12 Drawing Sheets

FLASH MEMORY DEVICE AND METHOD OF CONTROLLING FLASH MEMORY DEVICE

CROSS-REFERENCE TO RELATED APPLICATIONS

This application is a continuation application of application Ser. No. 12/109,466 filed on Apr. 25, 2008, which issued as U.S. Pat. No. 7,768,831, on Aug. 3, 2010, which claims priority from Korean Patent Application No. 10-2007-0040502, filed on Apr. 25, 2007, in the Korean Intellectual Property Office, the disclosures of which are hereby incorporated by reference in their entireties.

BACKGROUND

The present invention disclosed herein relates to a semiconductor memory device and more particularly, to a flash memory device and control method of a flash memory device.

Semiconductor memory devices are generally classified as volatile or nonvolatile. Advantages of volatile semiconductor memory devices include rapid read and write speeds, and disadvantages include losing stored contents when power is removed. In comparison, nonvolatile semiconductor memory devices are able to retain stored contents, even when power is removed. Therefore, nonvolatile semiconductor memory devices are used for applications that require contents to be stored regardless of whether power is continually applied. Nonvolatile semiconductor memory devices include, for example, mask read-only memory (MROM), programmable read-only memory (PROM), erasable programmable read-only memory (EPROM), electrically erasable programmable read-only memory (EEPROM), and the like.

Some non-volatile memories, however, such as MROM, PROM and EPROM, can not to be erased or written to by a system itself, so it is difficult for general users to update stored contents. On the other hand, EEPROM is capable of being electrically erased or written. Accordingly, EEPROM applications have widened to auxiliary memories and system programming requiring continuous updates (e.g., flash EEPROM). Flash EEPROM exhibits higher degree of integration than conventional EEPROM, and is therefore particularly suited for large auxiliary memory applications. A NAND-type flash EEPROM (hereinafter, referred to as a NAND flash memory device) is more highly integrated than other types of flash EEPROMs.

In general, a flash memory device is an integrated circuit configured to store information and to read stored information, as needed. A flash memory device may include multiple memory cells having re-writing capabilities. Each of the memory cells may store single-bit data or multi-bit data. A flash memory device may have increased functionality due to high integration, large volume, and the like. Although this trend decreases minimum feature size, it may increase complexity and thus reduce chip yield.

Therefore, a flash memory device may include redundant memory cells for replacing defective memory cells, as well as means for switching an address of a defective memory cell to an address of a redundant memory cell. If a bad block having defective memory cells is detected during testing, a row decoder may be set so that the bad block is not selected. The row decoder may include a block decoder for selecting rows in a block unit. The block decoder includes a fuse or a latch circuit that is set to interrupt accessing a bad block.

FIGS. 1A and 1B are circuit diagrams showing conventional block decoders configured to interrupt access to a bad block. FIG. 1A shows an example of a block decoder configured such that a bad block is processed based on whether a fuse 12 is programmed. FIG. 1B shows an example of a block decoder configured such that a bad block is processed based on information stored in a latch 22.

Referring to FIG. 1A, a memory block is treated as a bad block by cutting the fuse 12 of block decoder 10. In this case, although block select signals Pi, Qi and Ri for selecting the memory block all are high, an output signal of NAND gate 11 is not transferred to node N1 when the fuse 12 is cut. Accordingly, the node N1 has a high level and a node N2 has a low level. As a result, selection of the bad block is interrupted, since a string select line SSL is grounded and a block word line BWL is set to a low level.

Referring to FIG. 1B, data indicating a bad block or a normal block may be stored in the latch 22 of block decoder 20. Logic "1" may be stored in the latch 22 to indicate a bad block and logic "0" may be stored in the latch 22 to indicate a normal block. When logic "1" is stored in the latch 22 of the block decoder 20, the logic "1" is sent to an input terminal of NOR gate 23. Node N3 is therefore set to a low level, regardless of the values of block select signals Pi, Qi and Ri.

As illustrated in FIGS. 1A and 1B, conventional block decoders include a fuse or a latch circuit for managing a bad block. However, such block decoder configurations increase complexity of the memory device and size of the row decoder. When a block decoder includes a fuse, the number of bad blocks may increase due to instability of fuse programming. When a block decoder includes a latch, an error may arise in an initial operation during which bad block information is stored in the latch. A flash memory device may further include means for writing data in a latch incorporated in the row decoder. Accordingly, a flash memory device is needed that is capable of managing bad blocks by means of a simple row decoder structure.

SUMMARY OF THE INVENTION

The present invention is directed to provide a flash memory device and control method capable of performing a repair operation without inputting bad block information into a row decoder.

One aspect of the present invention provides a flash memory device, which includes multiple memory blocks, a decoder configured to select at least one of the memory blocks in response to block select signals, and a controller configured to generate the block select signals in response to a block address. When the block address corresponds to a bad block, the controller generates the block select signals to cause the decoder to interrupt selection of a memory block corresponding to the block address.

Another aspect of the present invention provides a flash memory device, which includes a cell array having multiple memory blocks; a redundant cell array having one or more redundant blocks; and multiple block decoders, corresponding to the memory blocks, for selecting corresponding memory blocks in response to block select signals, respectively. The flash memory device also includes a repair controller for generating the block select signals in response to a block address and a redundant block decoder for activating a redundant block of the one or more redundant blocks when the block address corresponds to a bad block. Each of the block decoders has no storage unit for storing bad block information. Also, the repair controller generates the block select signals to interrupt selecting the bad block.

Still another aspect of the present invention provides a method of managing a bad block in a flash memory device, including a memory block and a block decoder for selecting the memory block in response to a block select signal. The method includes comparing an input block address with a bad block address, which indicates a defective memory block; generating a flag signal when the input block address corresponds to the bad block address; and generating an output signal in response to the flag signal, the output signal externally indicating that the block address corresponds to the bad block address. The block decoder does not store information indicating the defective memory block.

BRIEF DESCRIPTION OF THE FIGURES

Non-limiting and non-exhaustive embodiments of the present invention will be described with reference to the attached drawings, in which.

DETAILED DESCRIPTION OF THE EMBODIMENTS

Figure 1A:
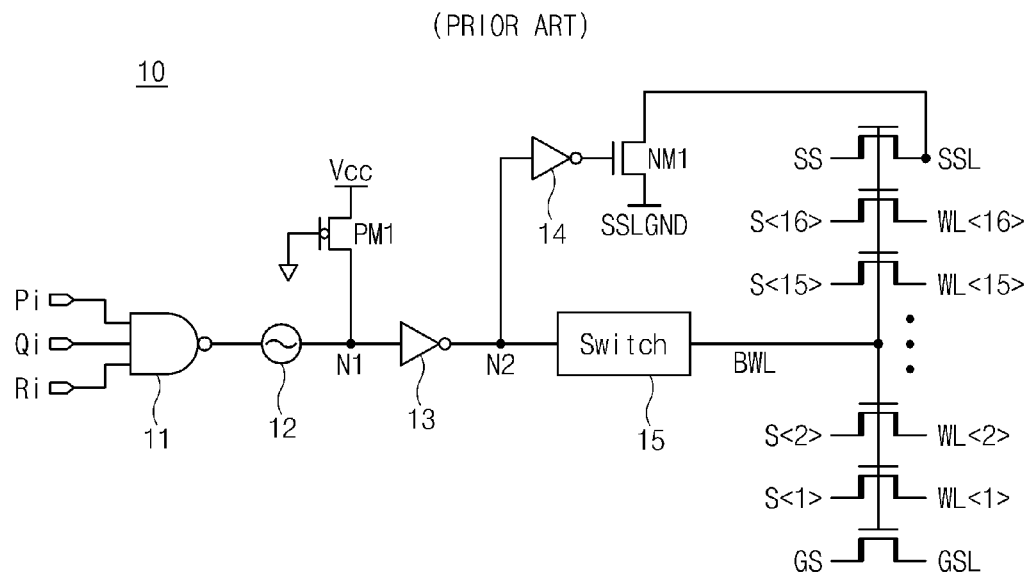
FIGS. 1A and 1B are circuit diagrams showing conventional block decoders.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements, unless otherwise specified.

Figure 2:
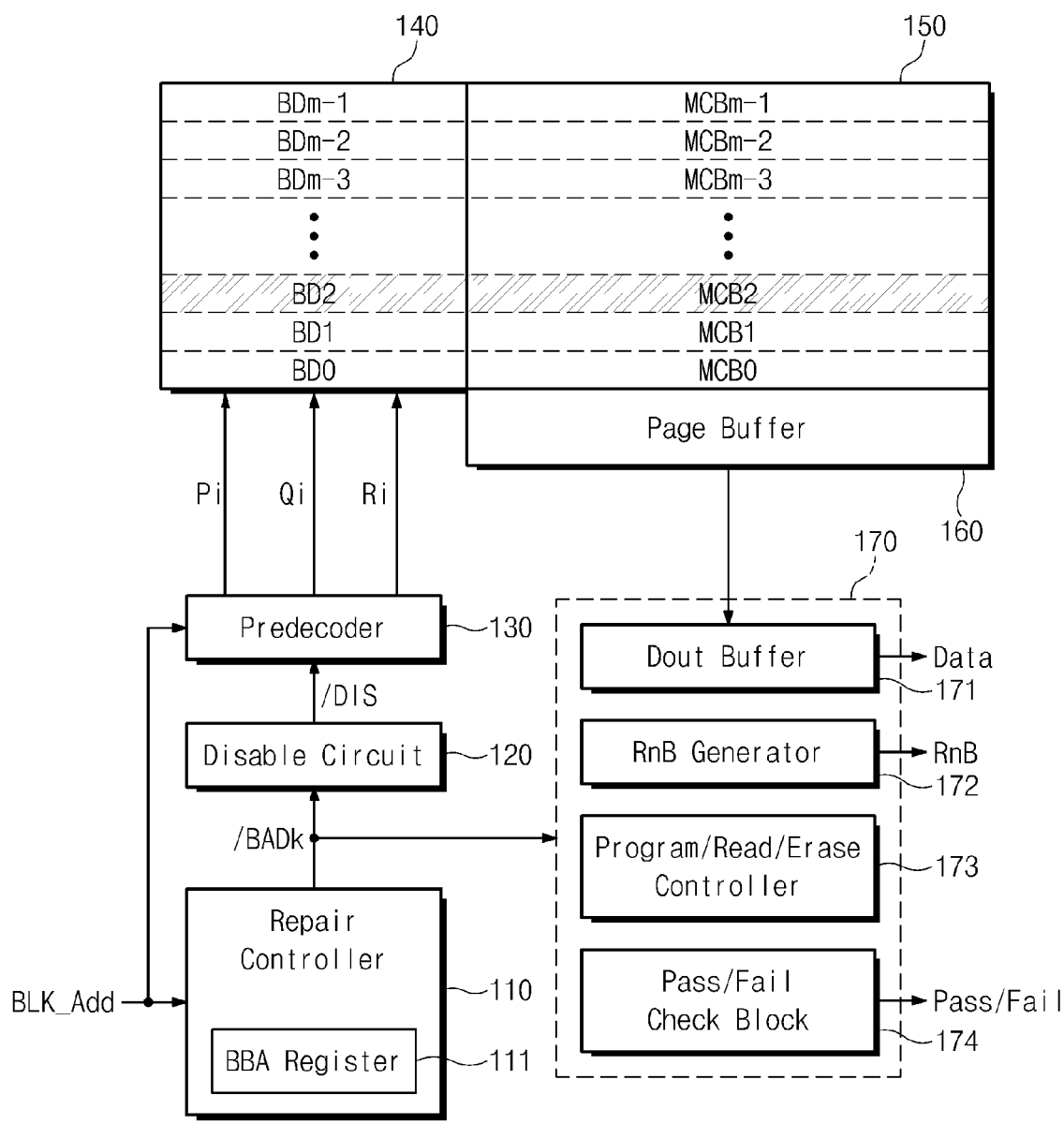
FIG. 2 is a block diagram showing a flash memory device, according to an exemplary embodiment of the present invention.

FIG. 2 is a block diagram showing a flash memory device, according to a first illustrative embodiment of the present invention.

Figure 1B:
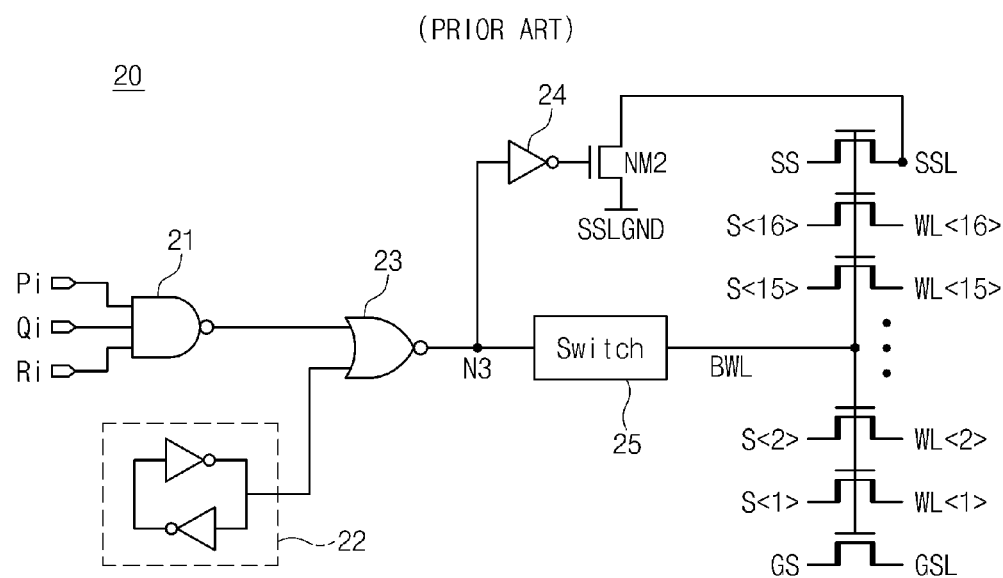

Referring to FIG. 2, a flash memory device 100 may include a row decoder 140, which does not include a fuse or a latch (such as those illustrated in FIGS. 1A and 1B) indicating a bad block. Regardless, the flash memory device 100 is capable of performing a repair operation with respect to bad blocks, in particular, by means of control system including a repair controller 110, a disable circuit 120 and a predecoder 130.

The repair controller 110 determines whether an input block address BLK_Add corresponds to a bad block. When the block address BLK_Add corresponds to one of k bad blocks, the repair controller 110 outputs a flag signal /BADk, which is supplied to the disable circuit 120. The disable circuit 120 generates a disable signal /DIS for inactivating a block decoder BDx (where x=0~m−1) corresponding to the block address BLK_Add in the row decoder 140. In order to produce the flag signal /BADk, the repair controller 110 may include a bad block address register 111, which stores addresses of bad blocks. During an initial operation of the flash memory device 100, the bad block addresses may be read from an initial data region of a cell array 150 and stored in the bad block address register 111.

The disable circuit 120 generates the disable signal /DIS for preventing selection of a block decoder BDx (e.g., BD2) corresponding to a bad block and/or a bad block address. When the flag signal /BADk is activated, the disable signal /DIS may be generated to prevent a memory block from being selected.

The predecoder 130 may decode a block address BLK_Add and generate block select signals Pi, Qi and Ri for selecting a memory block. The row decoder 140 selects a memory block in response to the block select signals Pi, Qi and Ri from the predecoder 130. When the disable signal /DIS is activated, the predecoder 130 generates block select signals Pi, Qi and Ri to inactivate a memory block corresponding to the input block address Pi, Qi and Ri.

The row decoder 140 may select a memory block and a page in response to a row address. In particular, the row decoder 140 may select a memory block and a page in response to the block select signals Pi, Qi and Ri. One of the pages in a selected memory block may be selected by a page address. However, each block decoder in the row decoder 140, according to the present embodiment, does not include a storage element (e.g., fuse or latch) indicating a bad block. An inactive operation to a bad block may be carried out only based on the block select signals Pi, Qi and Ri. A structure of respective block decoders BD0 to BDm−1 in the row decoder 140 will be more fully described with reference to FIG. 3, below.

The cell array 150 includes multiple memory blocks MCBx (where x=0~m−1), which are connected to corresponding block decoders DBx in the row decoder 140, respectively. The cell array 150 may include defective memory cells from the process level. A memory block having defective memory cell(s) is called a bad block, such as bad block MCB2, for example, which may be connected to corresponding block decoder BD2.

A page buffer 160 may program memory cells in a selected page, or may sense and amplify data stored in memory cells in a selected page. That is, the page buffer 160 may operate as a write driver or as a sense amplifier based upon a mode of operation. For example, in a read mode of operation, the page buffer 160 may sense and store data stored in selected memory cells (e.g., memory cells in a selected page).

A peripheral block 170 performs a data input/output operation, generating, for example, a ready/busy signal RnB, a pass/fail check operation, etc. when a bad block is selected.

The flash memory device 100, according to the embodiment of the present invention, does not include redundant cells for replacing bad blocks. Accordingly, it is necessary to inform external systems, such as a memory controller (not shown), that an input block address BLK_Add is an address of a bad block. The peripheral block 170 may control the page buffer 160 or a voltage generator (not shown) to prevent an operation corresponding to a command input together with a bad block address. The peripheral block 170 informs the external system that an address corresponding to a bad block is input. A detailed description of the peripheral block 170 follows.

A data output buffer 171 may prevent data from being output in response to the flag signal /BADk. Alternatively, when the flag signal /BADk is activated, the data output buffer 171 may output fixed data indicating that a bad block is selected. For example, the data output buffer 171 may output page data consisting of data "1" of an erase state during a data output cycle.

A ready/busy (RnB) generator 172 is capable of outputting an indication that a block address BLK_Add corresponds to a bad block, via a ready/busy signal RnB. While fixed data is output from the data output buffer 171, the ready/busy generator 172 is capable of outputting externally that a bad block address has been input. Alternatively, while a data output operation of the data output buffer 171 is interrupted, the ready/busy generator 172 is capable of sending an indication that a bad block address is input. For example, when the flag signal /BADk is activated, the ready/busy generator 172 may set the ready/busy signal RnB to a busy state "BUSY." Alternatively, during a data output cycle, the read/busy generator 172 may be set to output the read/busy signal RnB having a busy state "BUSY." As a result, a memory controller (not shown) may select another memory block with reference to a state of the ready/busy signal RnB. In various embodiments, indications of whether a bad block address has been input can be provided externally using only one of the data output buffer 171 and the ready/busy generator 172.

A program/read/erase controller 173 may interrupt a program, read or erase operation of a cell region corresponding to a block address BLK_Add in response to the flag signal /BADk. It is therefore possible to prevent generation of high voltages for a program, read or erase operation or a bit line setup operation of the page buffer 160, for example. These interruption operations may be made organically, for example, by generating the read/busy signal RnB.

A pass/fail check part 174 is configured to check whether data of programmed or erased memory cells is pass data. In the disclosed embodiment, it is possible to use the pass//fail check part 174 to inform internal control logic that an input address corresponds to a bad block, in response to the flag signal /BADk.

In accordance with the above-described flash memory device, it is possible to prevent accessing a bad block, without incorporating a fuse, a latch or other storage element in each block decoder of the row decoder 140, for indicating the bad block. When an address corresponding to a bad block is input, the flash memory device 100 may output information (e.g., RnB and/or fixed data) externally indicating that a bad block has been selected. Accordingly, it is possible to cope with a bad block by confirming the output information (e.g., RnB and/or fixed data) and selecting a different memory block.

Figure 3:
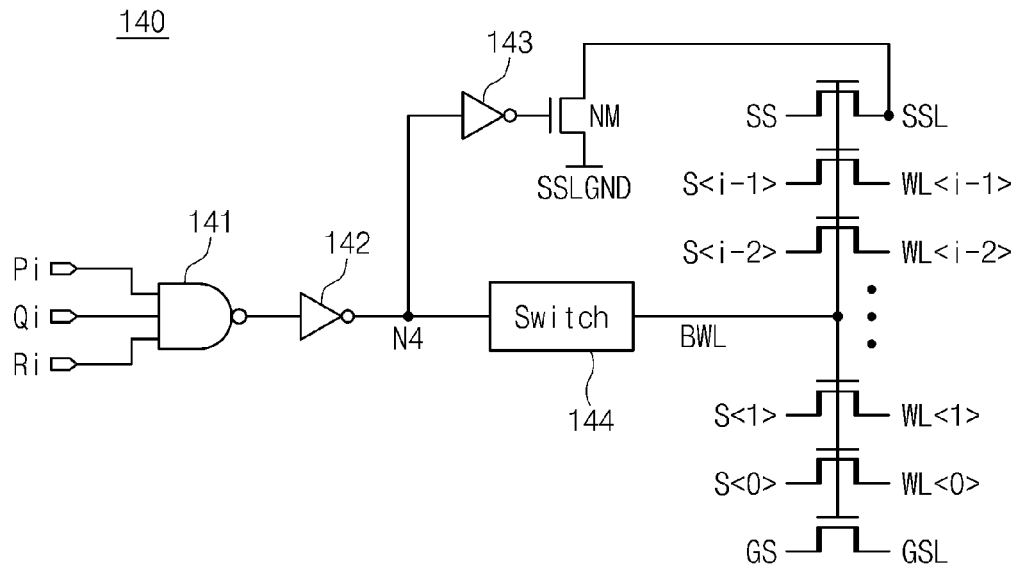
FIG. 3 is a circuit diagram showing a block decoder illustrated in FIG. 2, according to an exemplary embodiment of the present invention.

FIG. 3 is a circuit diagram showing a block decoder illustrated in FIG. 2, according to an illustrative embodiment of the present invention.

Referring to FIG. 3, the row decoder 140 may include block decoders BD0 to BDm−1, respectively corresponding to memory blocks. Each of the block decoders BD0 to BDm−1 does not include a storage element indicating a bad block. For example, a block decoder BDx does not have a fuse cut in case of a bad block or a latch for interrupting transferring of block select signals Pi, Qi and Ri. Accordingly, the row decoder 140 may occupy less chip area than that of a conventional row decoder having fuses or latches.

Referring to FIG. 3, if block select signals Pi, Qi and Ri are all activated, node N4 is set to a high level, and switch transistor NM for disabling a string select line SSL is cut off. A high-voltage switch 144 drives a block word line BWL with a high voltage based on a logic value of the node N4. Whether a memory block is selected may thus be determined only by block select signals Pi, Qi and Ri. Accordingly, a block decoder BDx of the present invention does not require a fuse, a latch or other storage element.

Figure 4:
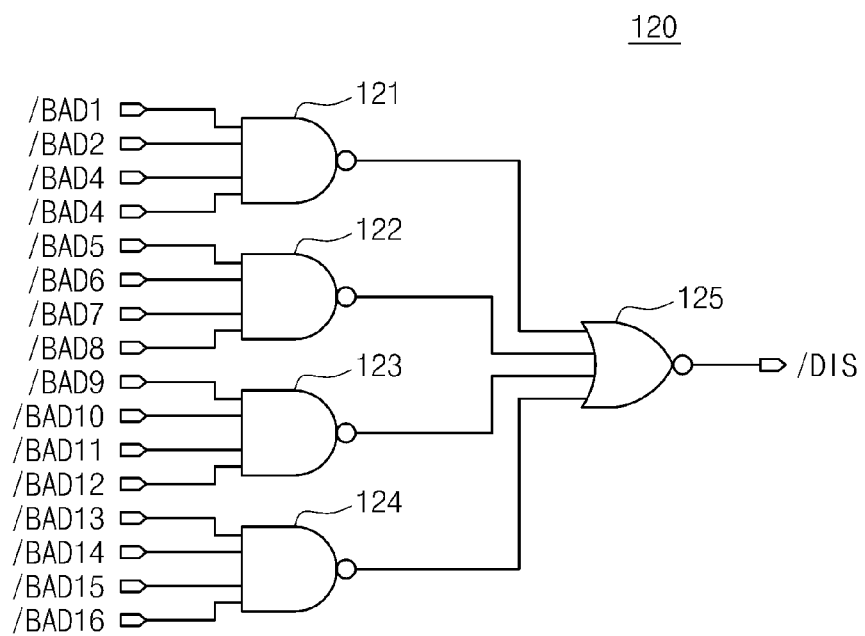
FIG. 4 is a circuit diagram showing a disable circuit illustrated in FIG. 2, according to an exemplary embodiment of the present invention.

FIG. 4 is a circuit diagram showing a disable circuit illustrated in FIG. 2, according to an illustrative embodiment of the present invention.

Referring to FIG. 4, the disable circuit 120 includes four NAND gates for receiving input flag signals /BADk (k=1~16). Each output is provided to NOR gate 125, which outputs a disable signal /DIS if any one of flag signals /BADk (k=1~16) corresponding to bad blocks is activated. In the depicted example, the disable circuit 120 activates the disable signal /DIS at a low level. Although the example depicts 16 bad blocks, it is apparent to one skilled in the art that the number of bad blocks is not limited to this example.

Figure 5A:
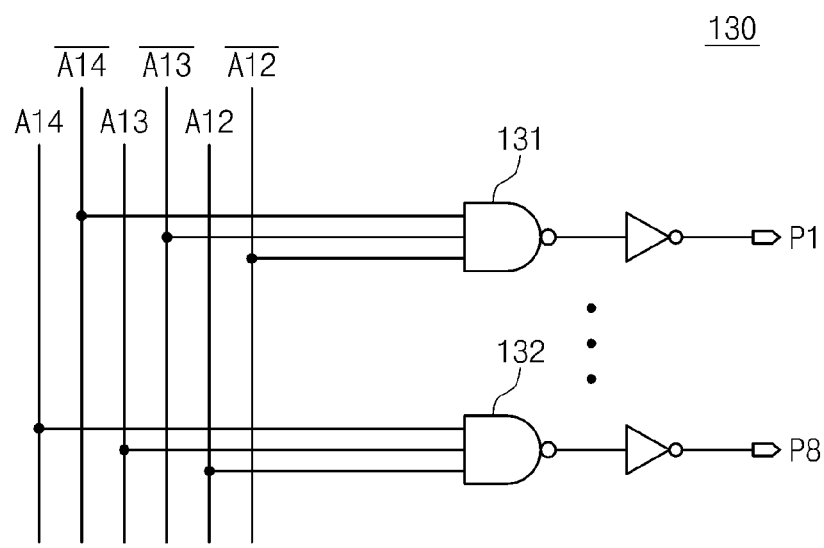
FIGS. 5A to 5C are circuit diagrams showing a predecoder illustrated in FIG. 2, according to an exemplary embodiment of the present invention.
Figure 5B:
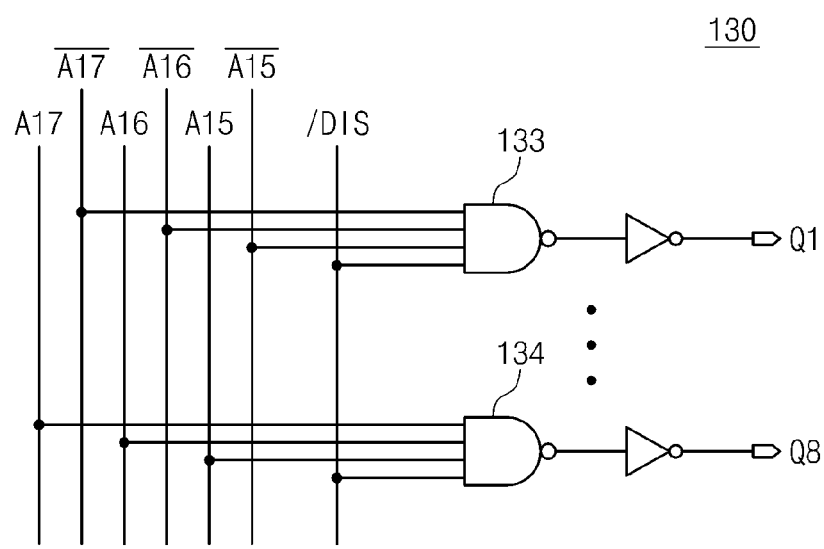
Figure 5C:
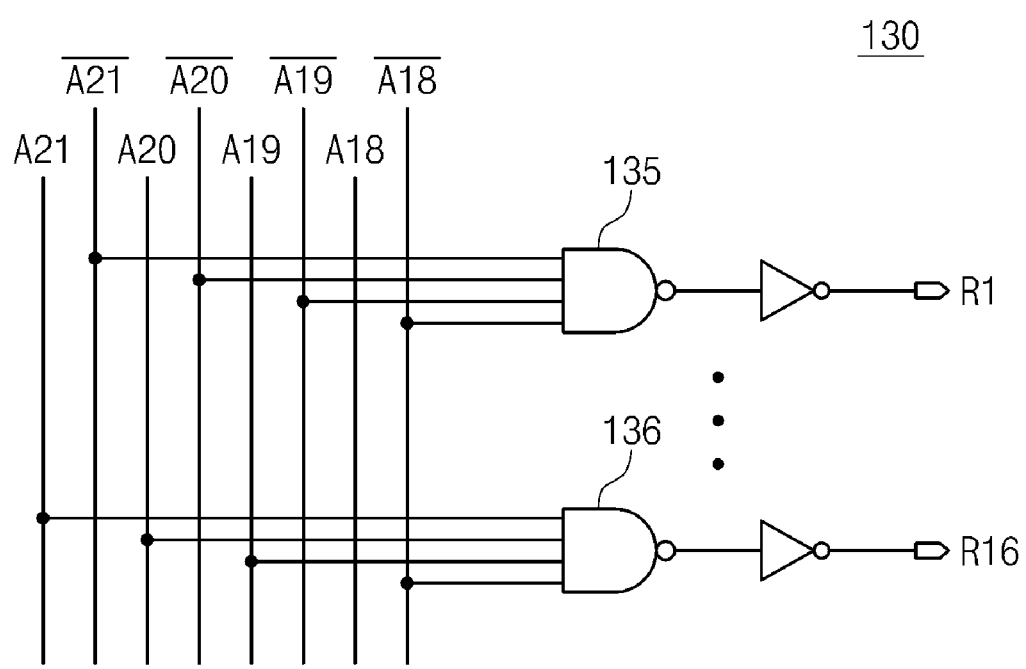

FIGS. 5A to 5C are circuit diagrams showing a predecoder illustrated in FIG. 2, according to illustrative embodiments of the present invention. The predecoder 130 is structured under the assumption that a block address BLK_Add consists of address bits A13~A21. Referring to FIG. 5A, block select signals P1~P8 may be obtained by decoding three address bits A12, A13 and A14, for example.

FIG. 5B shows part of the predecoder 130 for decoding address bits A15~A17 and generating block select signals Q1~Q8. A disable signal /DIS may be applied to respective NAND gates 133~134 for decoding address bits A15~A17. Accordingly, block select signals Q1~Q8 may be set to a low level when the disable signal /DIS is activated low (logic "0"). FIG. 5C shows part of the predecoder 130 for decoding address bits A18~A21 and generating block select signals R1~R16.

In accordance with the exemplary configuration of the predecoder 130, when the disable signal /DIS is activated, the block select signals Q1~Q8 may be set to a low level, so that selection of a memory block corresponding to a block address BLK_Add may be interrupted.

Figure 6A:
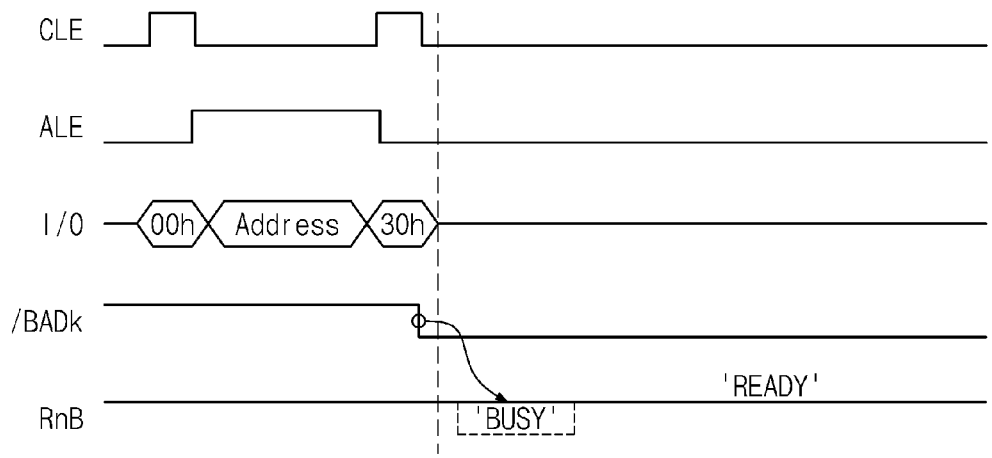
FIGS. 6A to 6C are timing diagrams for read, program and write operations, according to exemplary embodiments of the present invention.
Figure 6B:
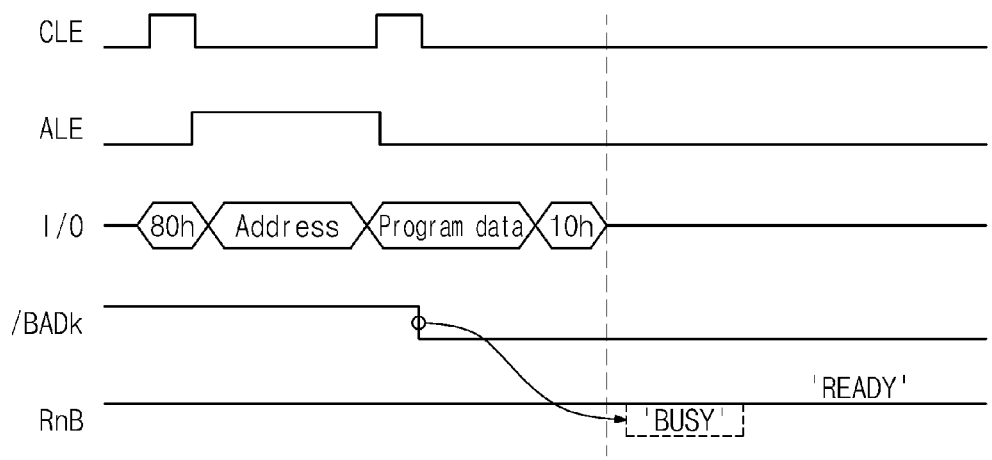
Figure 6C:
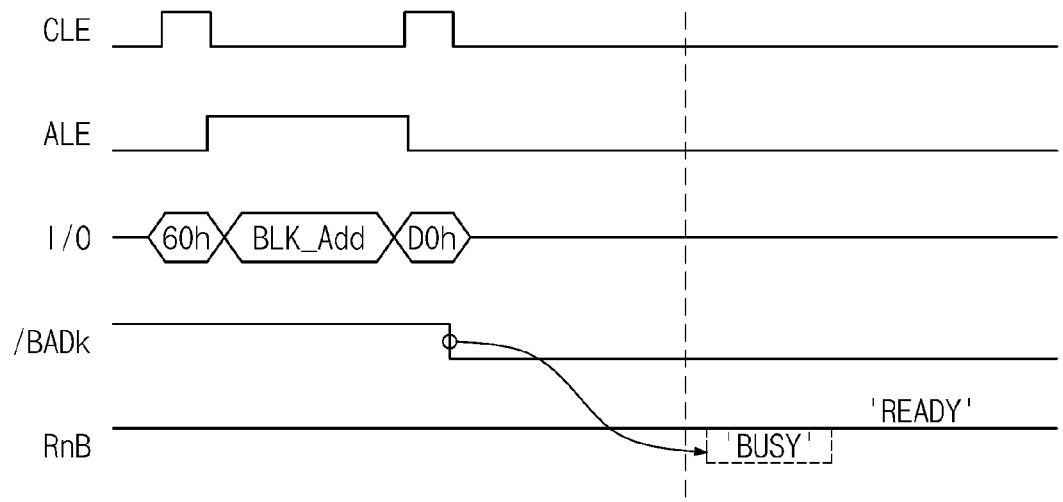

FIGS. 6A to 6C are timing diagrams illustrating exemplary read, program and write operations of a flash memory device, according to illustrative embodiments of the present invention.

As more fully described below, examples are provided showing use of a ready/busy signal RnB to inform an external system that an address corresponding to a bad block has been received. FIGS. 6A to 6C illustrate examples in which the ready/busy signal RnB is set to maintain a ready state "READY" when a flag signal /BADk is activated.

FIG. 6A is a timing diagram showing an exemplary variation of a ready/busy signal RnB during a read operation. When any one of the multiple flag signals /BADk is activated, the ready/busy generator 172 causes the ready/busy signal RnB to be retained in a ready state "READY." In comparison, if an address is received in a conventional flash memory device, the ready/bus signal RnB goes to a busy state "BUSY" following an input of an address, as illustrated by a dashed line in FIG. 6A, and then transitions to the ready state "READY." At this time, read-out data may be output to an I/O bus. In the flash memory device according to embodiments of the present invention, when the flag signal /BADk is activated, the ready/busy signal RnB is retained in the ready state "READY" without transition into the busy state "BUSY." Based on the state of the ready/busy signal RnB, a memory controller (not shown) is able to confirm that the address provided to the flash memory device corresponds to a bad block and to select a different memory block.

FIG. 6B is a timing diagram showing an exemplary variation of a ready/busy signal RnB during a program operation. Generally, a ready/busy signal RnB may be set to output a busy state "BUSY" following an input of address and program data, as illustrated by a dashed line in FIG. 6B. In contrast, in the flash memory device according to embodiments of the present invention, when the flag signal /BADk is activated, the ready/busy signal RnB is retained in the ready state "READY" without transition to the busy state "BUSY." Based on the state of the ready/busy signal RnB, a memory controller (not shown) is able to confirm that the address provided to the flash memory device corresponds to a bad block and to select a different memory block.

FIG. 6C is a timing diagram showing an exemplary variation of a ready/busy signal RnB during an erase operation. Referring to FIG. 6C, when a block address BLK_Add input for an erase operation corresponds to a bad block, a flag signal /BADk may be activated, as illustrated in FIG. 6C. The program/read/erase controller 173, for example, may interrupt a required erase operation in response to activation of the flag signal /BADk. The ready/busy generator 172 retains the ready/busy signal RnB in a ready state "READY" in response to activation of the flag signal /BADk. In other words, there is no transition to a busy state "BUSY," illustrated by the dashed line. A memory controller (not shown) is able to confirm selection of a bad block based on the ready/busy signal RnB being in the ready state "READY," and the erase operation of a selected memory block is interrupted.

Based on the above-described exemplary operations of the peripheral block 170, as depicted in FIGS. 6A to 6C, it is possible to confirm when a bad block is selected. Accordingly, the memory controller (not shown) is capable of selecting a normal memory block instead of a bad block.

Figure 7A:
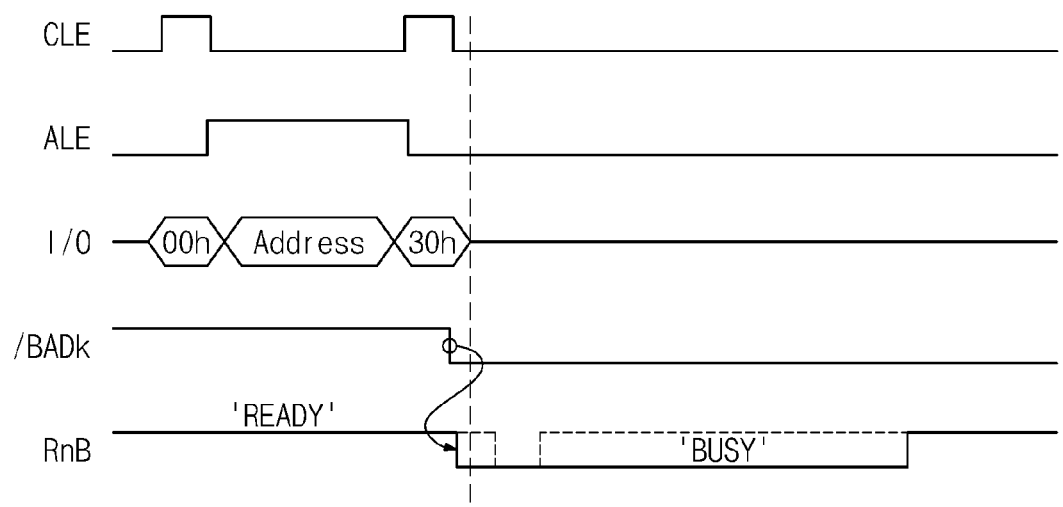
FIGS. 7A to 7C are timing diagrams for read, program and write operations, according to exemplary embodiments of the present invention.
Figure 7B:
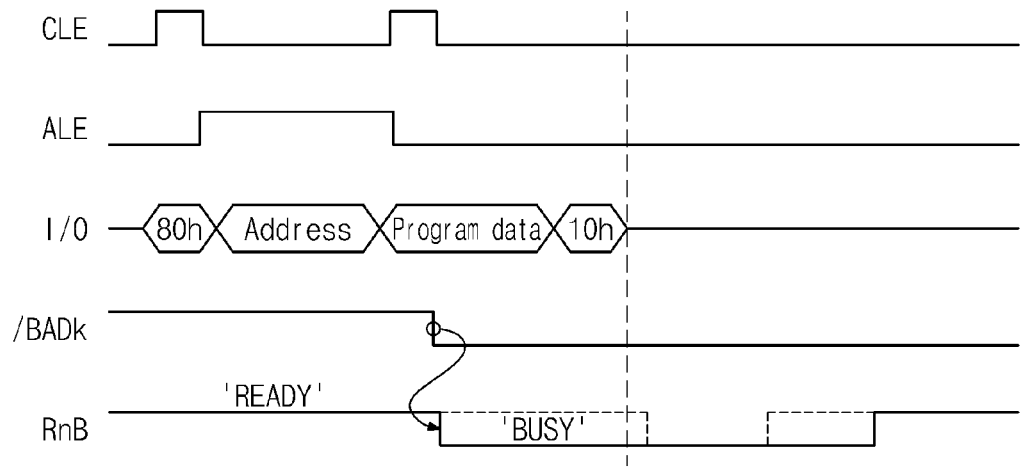
Figure 7C:
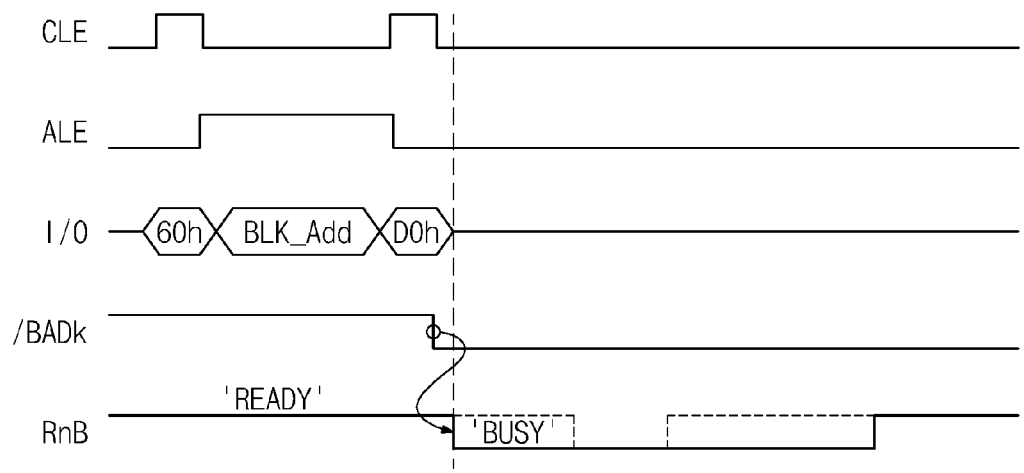

FIGS. 7A to 7C are timing diagrams illustrating exemplary operations of the peripheral block 170, in which a ready/busy signal RnB is maintained in a busy state "BUSY" upon activation of a flag signal /BADk.

FIG. 7A is a timing diagram showing an exemplary variation of a ready/busy signal RnB during a read operation. When a flag signal /BADk is activated, the program/read/erase controller 173 interrupts a data read-out operation with respect to the cell array 150, and the data output buffer 171 is disabled so data is not output. At this time, the ready/busy generator 172 retains a ready/busy signal RnB in a busy state "BUSY" during a data output cycle, as illustrated by the solid line. In FIG. 7A, the dashed line indicates a state of the ready/busy signal RnB when a normal memory block is accessed.

FIG. 7B is a timing diagram showing an exemplary variation of a ready/busy signal RnB during a program operation. When a flag signal /BADk is activated, the program/read/erase controller 173 interrupts a data write operation with respect to the cell array 150. The ready/busy generator 172 retains the ready/busy signal RnB in a busy state "BUSY" during a normal program cycle, as illustrated by the solid line in FIG. 7B. In FIG. 7B, the dashed line indicates a state of the ready/busy signal RnB when a normal memory block is accessed.

FIG. 7C is a timing diagram showing an exemplary variation of a ready/busy signal RnB during an erase operation. When a flag signal /BADk is activated, the program/read/erase controller 173 interrupts an erase operation with respect to a memory block that corresponds to a block address BLK_Add. The ready/busy generator 172 causes the ready/busy signal RnB to be set to a busy state "BUSY" during a normal erase cycle, as illustrated by the solid line in FIG. 7C. In FIG. 7C, the dashed line indicates a state of the ready/busy signal RnB when a normal memory block is accessed.

As indicated by the timing diagrams of FIGS. 7A to 7C, if an address corresponding to a bad block is input, an internal operation corresponding to an input command may be interrupted. At this time, the ready/busy generator 172 maintains the ready/busy signal RnB in a busy state "BUSY" during a corresponding cycle. It is thus possible for users to recognize selection of a bad block based on the state of the ready/busy signal RnB. Further, it is possible for users to select a normal memory block instead of a bad block, in order to again perform a program/read/erase operation.

Figure 8:
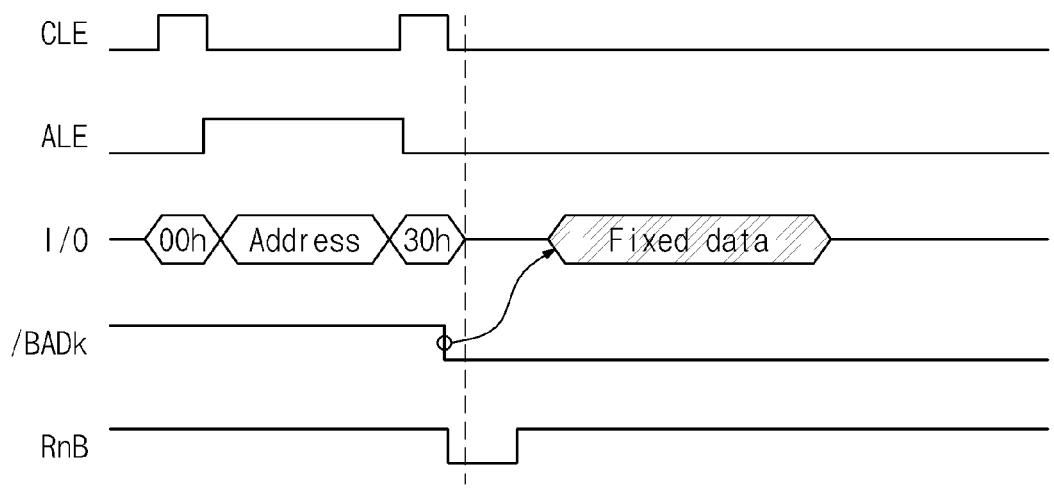
FIG. 8 is a timing diagram for a read operation, according to exemplary embodiments of the present invention.

FIG. 8 is a timing diagram illustrating an exemplary read operation of a flash memory device, according to illustrative embodiments of the present invention. When a flag signal /BADk is activated, the data output buffer 171 outputs fixed data indicating selection of a bad block, instead of data sensed and latched by the page buffer 160. At this time, the ready/busy generator 172 and the program/read/erase controller 173 may operate normally. Although not shown in the figures, it is possible to load the fixed data to the data output buffer 171 from an additionally prepared latch circuit and to output the loaded data from the data output buffer 171. Accordingly, it is possible to detect whether a bad block has been selected, based on fixed data transferred via an input/output bus instead of the ready/busy signal RnB.

It is understood that the previously described embodiments of the present invention use a flash memory device that does not have a redundant block. However, a redundant block can be provided in a flash memory device together with a row decoder structure, as illustrated in FIG. 2, for example.

Figure 9:
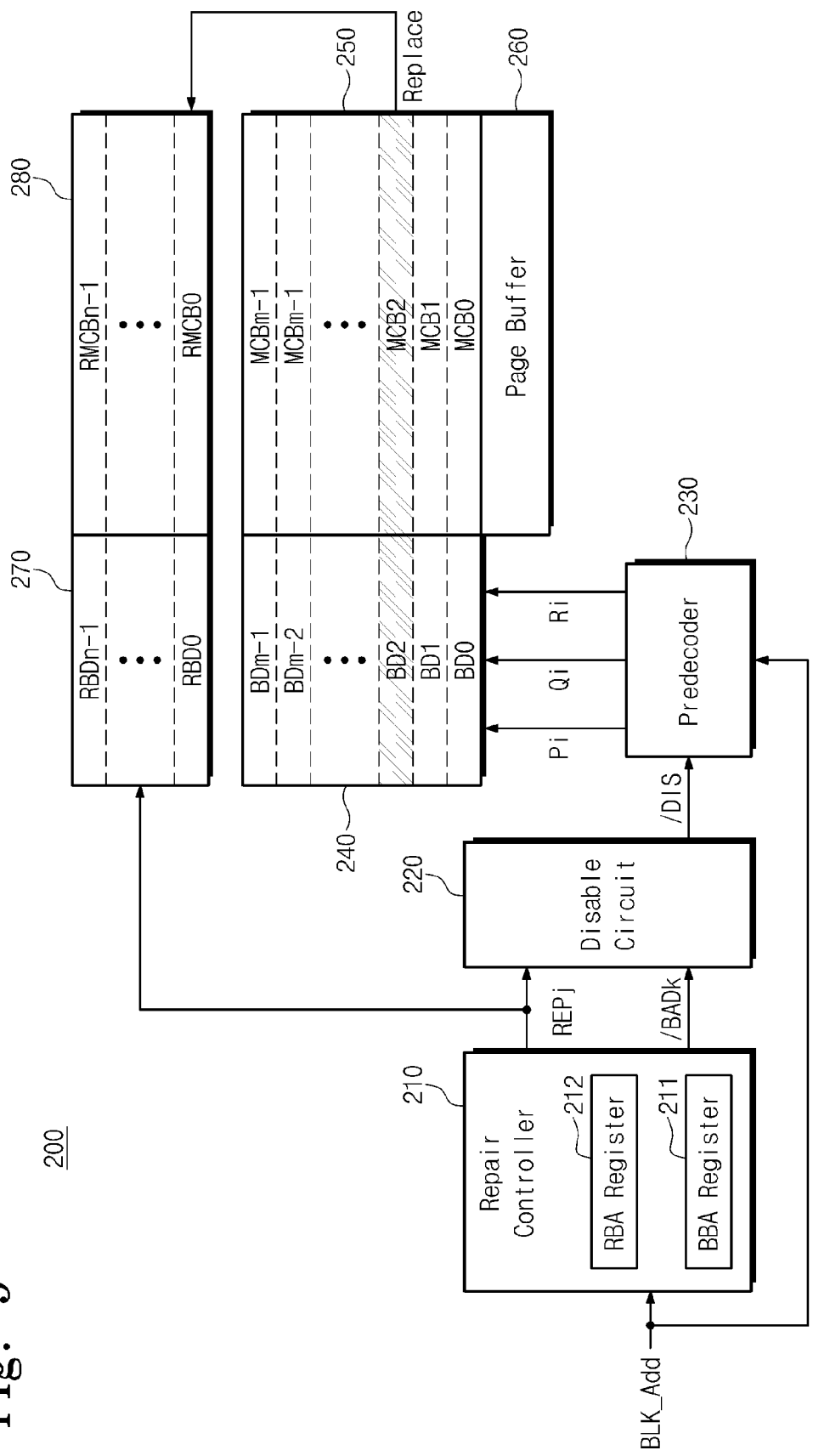
FIG. 9 is a block diagram showing a flash memory device, according to another exemplary embodiment of the present invention.

FIG. 9 is a block diagram showing a flash memory device, according to another illustrative embodiment of the present invention. Referring to FIG. 9, a flash memory device 200 includes a main row decoder 240 and a redundant row decoder 270. The main row decoder 240 does not include a storage element, such as a fuse or latch, for indicating a bad block. The flash memory device 200 further includes a repair controller 210, a disable circuit 220 and a predecoder 230. The repair controller 210 is capable of performing a repair operation with respect to a bad block.

For example, the repair controller 210 is configured to detect whether an input block address BLK_Add corresponds to a bad block. When a block address BLK_Add corresponds to a bad block, the repair controller 210 may output a flag signal /BADk indicating that the block address BLK_Add is a bad block. The repair controller 210 generates a repair signal REPj for selecting a redundant block decoder RBDj that corresponds to the block address BLK_Add. The repair controller 210 may include a bad block address register 211 for storing bad block addresses and a redundant block address register 212 for storing redundant block addresses. During an initial operation of the flash memory device 200, bad block addresses may be read out from an initial data region of a cell array 250 and stored in the bad block address register 211.

The disable circuit 220 generates a disable signal /DIS that is used to inactivate a block decoder (e.g., BD2) of the main row decoder 240 corresponding to a bad block. The disable circuit 220 may activate the disable signal /DIS to prevent selection of a memory block when the flag signal /BADk is activated. Alternatively, the disable circuit 220 may activate the disable signal /DIS when a repair signal REPj for switching a bad block to a normal block is activated. A detailed description with respect to the disable circuit 220 follows with reference to FIG. 10.

The predecoder 230 decodes a block address BLK_Add and generates block select signals Pi, Qi and Ri for selecting a memory block. The block select signals Pi, Qi and Ri may be sent to the main row decoder 240 to select a memory block. However, if the disable signal /DIS is activated, the predecoder 230 may generate the block select signals Pi, Qi and Ri to interrupt selection of a memory block that corresponds to an input block address BLK_Add.

The main row decoder 240 selects a memory block and a row in response to a row address. In particular, the main row decoder 240 may include multiple block decoders BDx, (e.g., BD0~BDm−1), each of which selects a corresponding memory block and a row in the corresponding memory block in response to a row address. For example, each of the block decoders BDx may select a memory block in response to block select signals Pi, Qi and Ri and select a row in the selected memory block in response to a page address. In accordance with the present embodiment, each block decoder BDx of the flash memory device does not include a fuse or a latch or other storage element used to indicate a bad block. This is because selecting and interrupting operations with respect to bad blocks are performed by the block select signals Pi, Qi and Ri. Each block decoder BDx may be structured as shown, for example, in FIG. 3.

The main cell array 250 may include multiple memory cells arranged in rows (e.g., word lines) and columns (e.g., bit lines). The memory cells constitute multiple memory blocks MCB0~MCBm−1 that correspond to the block decoders BD0~BDm−1 in the main row decoder 240, respectively.

A page buffer 260 may program memory cells in a selected page of a selected memory block, or sense and amplify data stored in the memory cells of the selected page. That is, the page buffer 260 may act as a write driver or a sense amplifier based upon a mode of operation. For example, the page buffer 260 may sense and store data stored in selected memory cells during a read mode of operation. If the flag signal /BADk is activated, the page buffer 260 may sense and amplify memory cells in a selected page of a redundant block (e.g., RMCB0) in which a bad block (e.g., MCB2) is placed.

A redundant row decoder 270 and a redundant cell array 280 may have the same structure as the main row decoder 240 and the main cell array 250, respectively. Redundant block decoders RBD0~RBDn−1 in the redundant row decoder 270 may be selected by repair signals REPj (where j=0~n−1) from the repair control block 210, respectively.

An illustrative embodiment of a flash memory device, including redundant memory blocks, has been described above with reference to accompanying drawings. As described, the flash memory device 200 is capable of interrupting access to a bad block, without including a storage element (e.g., fuse or latch) used to indicate the bad block. That is, the bad block is switched to a corresponding redundant block under control of the repair controller 210.

Figure 10:
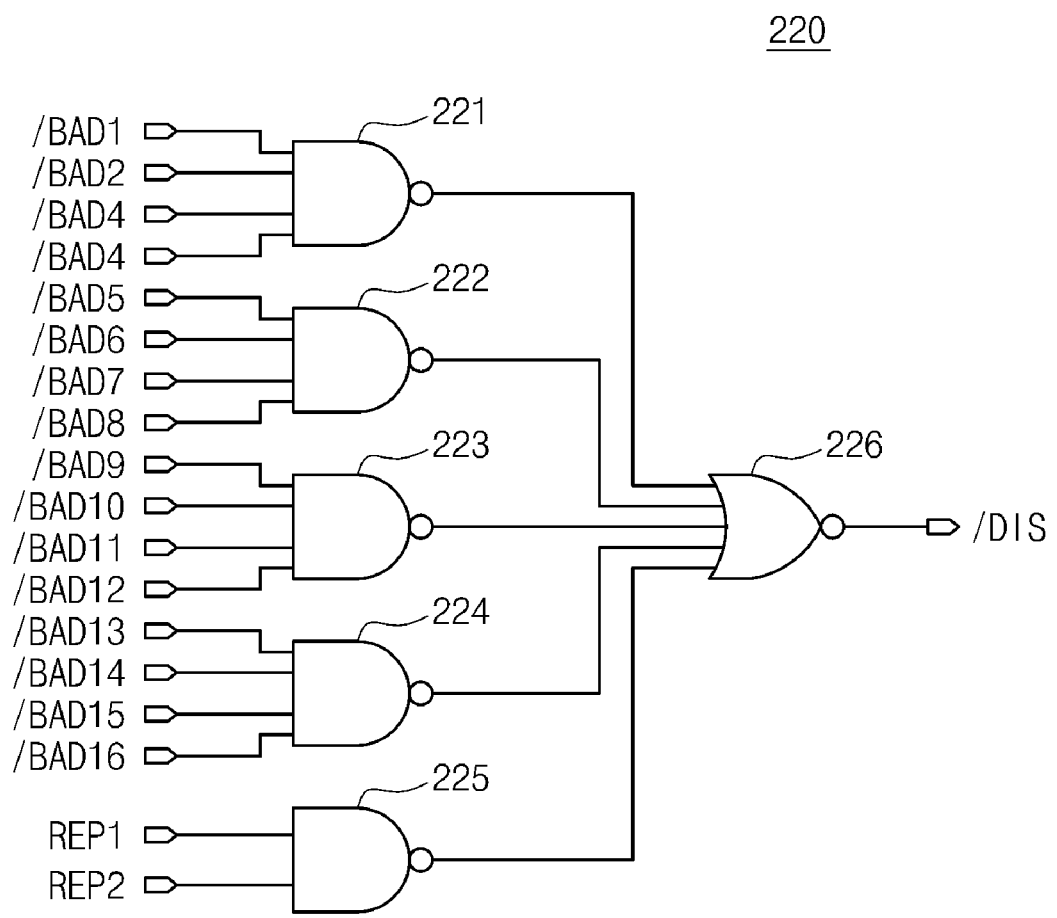
FIG. 10 is a circuit diagram showing a disable circuit illustrated in FIG. 9, according to an exemplary embodiment of the present invention.

FIG. 10 is a circuit diagram showing a disable circuit illustrated in FIG. 9, according to an illustrative embodiment of the present invention. For convenience of description, it is assumed that the flash memory device 200 includes 16 bad blocks and two redundant blocks.

Referring to FIG. 10, the disable circuit 220 includes NAND gates 221, 222, 223, 224 and 225 and NOR gate 226, which are connected as illustrated in FIG. 10. In accordance with this exemplary configuration of the disable circuit 220, a disable signal /DIS may be activated in response to any one of flag signals /BAD1~/BAD16 or repair signals REP1~REP2 being activated. In the depicted example, the disable circuit 220 activates the disable signal /DIS at a low level. As stated above, although the example depicts 16 bad blocks and two redundant blocks, it is apparent to one skilled in the art that the number of blocks is not limited to this example.

Figure 11:
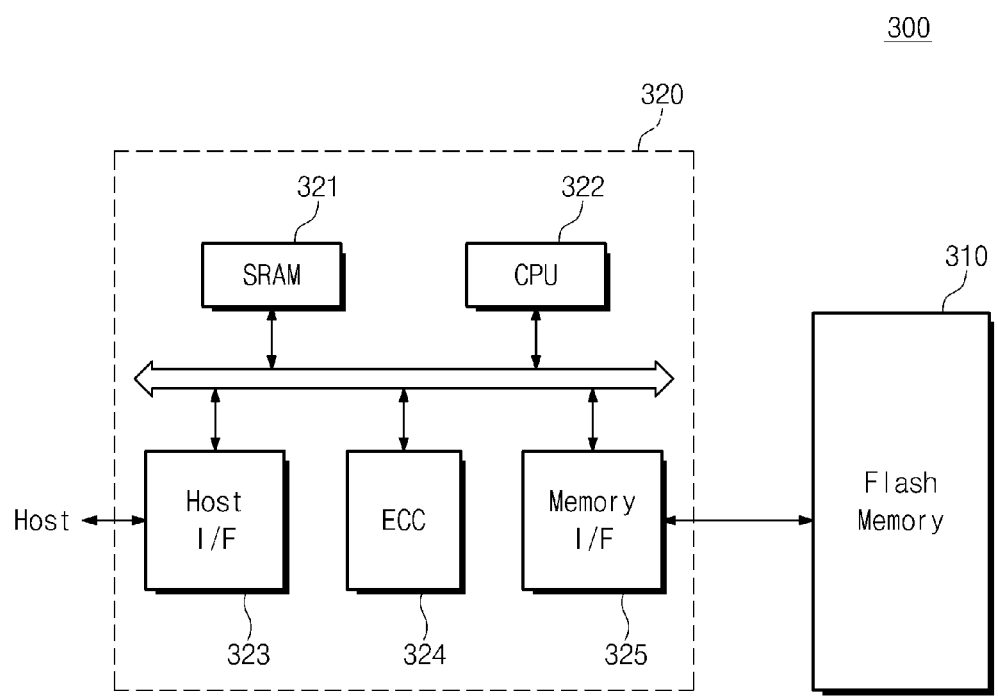
FIG. 11 is a block diagram showing a memory card including a flash memory device, according to exemplary embodiments of the present invention.

FIG. 11 is a block diagram showing a memory card including a flash memory device, according to illustrative embodiments of the present invention. Referring to FIG. 11, a memory card 300 supports a large-volume data storing capacity, and may include flash memory device 310, according to embodiments of the present invention. The memory card 300 may further include a memory controller 320 configured to control data exchanges between a Host and the flash memory device 310. The flash memory device 310 may include block decoders, none of which include a fuse or latch for indicating bad blocks. The memory controller 320 may be configured to detect whether an address provided to the flash memory device 310 corresponds to a bad block, based upon input/output data or a ready/busy signal RnB, as described above.

Static random access memory (SRAM) 321 may be used as a work memory of a processing unit 322 (e.g., CPU). A host interface 323 may include a data exchange protocol of a host connected with the memory card 300. An error checking and correcting (ECC) block 324 may be used to detect and correct errors in data read from the flash memory device 310 that is capable of storing single bit data and/or multi-bit data. A memory interface 325 may be configured to interface with the flash memory device 310. The processing unit 322 may perform an overall control operation for data exchange of the memory controller 320. Although not shown in figures, it would be apparent to one skilled in the art that the memory card 300 may further include read only memory (ROM), for example, used to store code data for interfacing with the host.

As set forth above, the flash memory device and memory system are capable of repairing bad blocks without using fuses or latches in block decoders. Accordingly, it is possible to reduce the size of row decoders and to improve the reliability of flash memory devices and memory systems including the flash memory devices.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
   a plurality of memory blocks;
   a decoder configured to select at least one of the plurality of memory blocks in response to block select signals;
   a controller configured to generate the block select signals in response to a block address and to generate a flag signal when the block address corresponds to a bad block; and
   a data output buffer configured to output fixed data in response to the flag signal, indicating that the block address corresponds to the bad block,
   wherein, when the block address corresponds to the bad block, the controller generates the block select signals to cause the decoder to interrupt selection of the memory block corresponding to the block address.

2. The flash memory device of claim 1, wherein the decoder has no storage element for storing bad block information.

3. The flash memory device of claim 1, wherein the controller comprises:
 a repair controller configured to generate the flag signal when the block address corresponds to the bad block;
 a disable circuit configured to generate a disable signal in response to the flag signal; and
 a predecoder configured to generate the block select signals in response to the block address,
 wherein the predecoder generates the block select signals to inactivate the bad block when the predecoder receives the disable signal.

4. The flash memory device of claim 3, wherein the repair controller comprises an address register that stores block addresses of bad blocks.

5. The flash memory device of claim 1, further comprising:
 a memory for storing the fixed data.

6. The flash memory device of claim 1, further comprising:
 a program/read/erase controller configured to interrupt one of a program/read/erase operation with respect to the memory block corresponding to the block address in response to the flag signal.

7. The flash memory device of claim 1, further comprising:
 a pass/fail detector configured to indicate a fail state in response to the flag signal.

8. A method of managing a bad block in a flash memory device, comprising a memory block and a block decoder for selecting the memory block in response to a block select signal, the method comprising:
 comparing an input block address with a bad block address, which indicates a defective memory block;
 generating a flag signal when the input block address corresponds to the bad block address; and
 outputting fixed data having a predetermined bit value via an input/output pin to indicate that the input block address corresponds to the bad block address,
 wherein the block decoder does not include a storage element for indicating the defective memory block.

9. The method of claim 8, further comprising:
 interrupting an internal operation corresponding to a command input with the input block address.

10. A memory system comprising:
 a flash memory device outputting a fixed data or a ready/busy signal in response to a block address corresponding to a bad block; and
 a memory controller configured to detect whether the block address provided to the flash memory device corresponds to the bad block, based upon the fixed data or the ready/busy signal.

11. The memory system of claim 10, wherein the flash memory device comprises:
 a plurality of memory blocks;
 a decoder configured to select at least one of the plurality of memory blocks in response to block select signals;
 a controller configured to generate the block select signals in response to the block address and to generate a flag signal when the block address corresponds to the bad block; and
 a data output buffer configured to output the fixed data in response to the flag signal, indicating that the block address corresponds to the bad block,
 wherein, when the block address corresponds to the bad block, the controller generates the block select signals to cause the decoder to interrupt selection of the memory block corresponding to the block address.

12. The memory system of claim 11, wherein the flash memory device further comprises a ready/busy generator configured to output the ready/busy signal having a predetermined pulse width indicating that the block address corresponds to the bad block.

13. The memory system of claim 11, wherein the decoder has no storage element for storing bad block information.

14. The memory system of claim 11, wherein the controller comprises:
 a repair controller configured to generate the flag signal when the block address corresponds to the bad block;
 a disable circuit configured to generate a disable signal in response to the flag signal; and
 a predecoder configured to generate the block select signals in response to the block address,
 wherein the predecoder generates the block select signals to inactivate the bad block when the predecoder receives the disable signal.

15. The memory system of claim 14, wherein the repair controller comprises an address register that stores block addresses of bad blocks.

16. The memory system of claim 11, wherein the flash memory device further comprises:
 a memory for storing the fixed data.

17. The memory system of claim 11, wherein the flash memory device further comprises:
 a program/read/erase controller configured to interrupt one of a program/read/erase operation with respect to the memory block corresponding to the block address in response to the flag signal.

18. The memory system of claim 11, wherein the flash memory device further comprises:
 a pass/fail detector configured to indicate a fail state in response to the flag signal.

* * * * *